United States Patent
Ahn et al.

(10) Patent No.: US 8,873,322 B2
(45) Date of Patent: Oct. 28, 2014

(54) NONVOLATILE MEMORY APPARATUS

(71) Applicant: SK hynix Inc., Icheon-si (KR)

(72) Inventors: Chang Yong Ahn, Icheon-si (KR); Yoon Jae Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/958,762

(22) Filed: Aug. 5, 2013

(65) Prior Publication Data

US 2014/0177368 A1    Jun. 26, 2014

(30) Foreign Application Priority Data

Dec. 21, 2012    (KR) .................. 10-2012-0150313

(51) Int. Cl.
     *G11C 7/12*      (2006.01)
     *G11C 13/00*      (2006.01)

(52) U.S. Cl.
     CPC .......... *G11C 13/004* (2013.01); *G11C 13/0004* (2013.01); *G11C 7/12* (2013.01); *G11C 2013/0045* (2013.01); *G11C 2013/0054* (2013.01)
     USPC ........... 365/207; 365/148; 365/158; 365/163; 365/189.07

(58) Field of Classification Search
     CPC .. G11C 7/62; G11C 11/5628; G11C 11/5642; G11C 13/004; G11C 13/0004; G11C 13/0026; G11C 13/0069; G11C 13/0483; G11C 16/0483; G11C 16/26

USPC ........ 365/207, 148, 158, 163, 185.21, 189.07
See application file for complete search history.

(56) References Cited

U.S. PATENT DOCUMENTS

| | | | | |
|---|---|---|---|---|
| 5,267,202 | A * | 11/1993 | Dallabora et al. | 365/185.2 |
| 6,133,600 | A * | 10/2000 | Sandhu | 257/308 |
| 6,314,028 | B1 * | 11/2001 | Kono | 365/189.09 |
| 7,483,305 | B2 * | 1/2009 | Yamada | 365/185.2 |
| 7,974,122 | B2 * | 7/2011 | Lin et al. | 365/163 |
| 8,169,831 | B2 * | 5/2012 | Nguyen et al. | 365/185.21 |
| 8,395,934 | B2 * | 3/2013 | Shin | 365/163 |
| 8,531,864 | B2 * | 9/2013 | Kim | 365/148 |
| 8,665,655 | B2 * | 3/2014 | Lee et al. | 365/189.07 |

FOREIGN PATENT DOCUMENTS

| KR | 1020120044785 A | 5/2012 |
|---|---|---|
| KR | 1020120096531 A | 8/2012 |

* cited by examiner

*Primary Examiner* — Tan T. Nguyen
(74) *Attorney, Agent, or Firm* — William Park & Associates Patent Ltd.

(57) ABSTRACT

A nonvolatile memory apparatus includes a memory cell configured to receive a first current and a second current through a bit line which is connected to a sensing node; a sensing node level control unit configured to be driven in response to a control signal, compare a reference voltage and a voltage of the sensing node, and output a driving signal to a driving node; a first current driving unit configured to output the first current to the driving node by using a first driving voltage in response to the driving signal; and a current control unit configured to perform a discharge operation of the bit line or electrically connect the driving node and the sensing node, in response to the control signal.

23 Claims, 5 Drawing Sheets

NONVOLATILE MEMORY APPARATUS

CROSS-REFERENCES TO RELATED APPLICATION

The present application claims priority under 35 U.S.C. §119(a) to Korean application number 10-2012-0150313, filed on Dec. 21, 2012, in the Korean Intellectual Property Office, which is incorporated herein by reference in its entirety.

BACKGROUND

1. Technical Field

Various embodiments relate to a semiconductor apparatus, and more particularly, to a bit line discharge circuit of a nonvolatile memory apparatus.

2. Related Art

A nonvolatile memory, in particular, a phase change RAM (PCRAM), which stores information using a phase change substance, is a nonvolatile memory apparatus which employs a phase change according to a temperature condition, that is, a resistance value change according to the phase change.

A phase change substance is a substance which can be changed into an amorphous state and a crystalline state according to a temperature condition. A typical phase change substance is a Chalcogenide alloy. Because a representative Chalcogenide alloy is Ge2Sb2Te5 (GST) which uses germanium (Ge), antimony (Sb) and tellurium (Te), a phase change substance is generally referred to as 'GST'.

In the PCRAM, a reversible phase change between the crystalline state and the amorphous state of the phase change substance (GST) occurs using Joule heating which is induced by application of current or a voltage of a specific condition to the phase change substance (GST). The crystalline state is referred to as a set state in terms of a circuit. In the set state, the phase change substance (GST) has electrical characteristics of a metal with a low resistance value. Also, the amorphous state is referred to as a reset state in terms of a circuit. In the reset state, the phase change substance (GST) has a resistance value higher than that in the set state. That is to say, the PCRAM stores information using a resistance value change between the crystalline state and the amorphous state, and discriminates stored information by sensing current flowing through the phase change substance (GST) or a voltage variation according to current variation.

Figure 1:
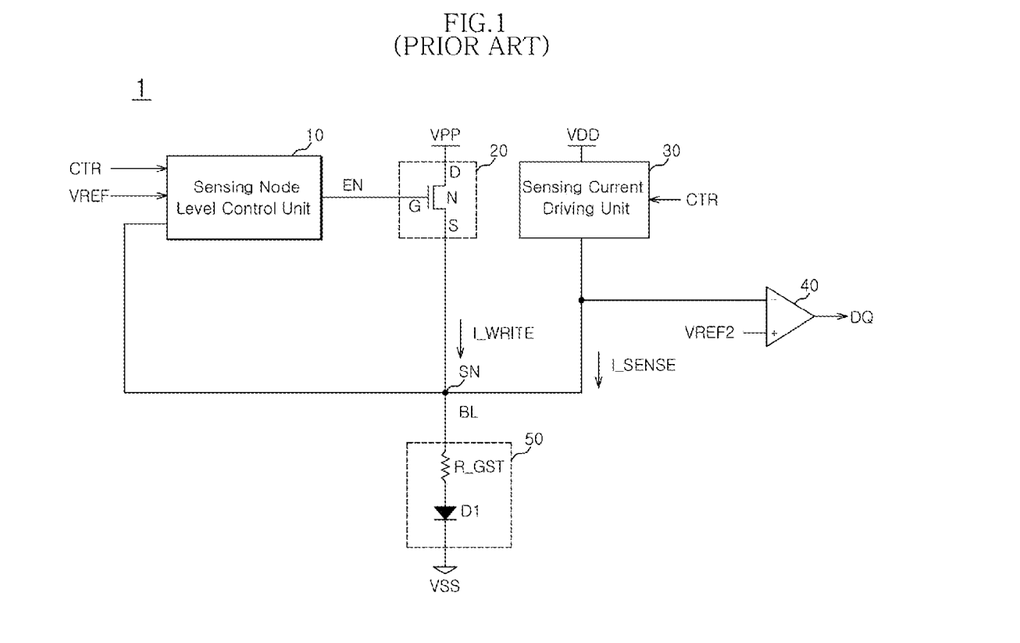
FIG. 1 is a block diagram of a conventional nonvolatile memory apparatus.

FIG. 1 is a block diagram of a conventional nonvolatile memory apparatus 1.

The nonvolatile memory apparatus 1 includes a sensing node level control unit 10, a write current driving unit 20, a sensing current driving unit 30, a sense amplifier 40, and a memory cell 50.

The write current driving unit 20 includes an NMOS transistor N. The memory cell 50 includes a phase change device R_GST which is constituted by a phase change substance, and a cell diode D1.

The sensing node level control unit 10 operates in response to a control signal CTR, compares a reference voltage VREF and the voltage of a sensing node SN, and outputs an enable signal EN. The control signal CTR is a signal which controls a read operation and a write operation of the nonvolatile memory apparatus 1. The control signal CTR drives the sensing node level control unit 10 in the write operation of the nonvolatile memory apparatus 1, and drives the sensing current driving unit 30 in the read operation of the nonvolatile memory apparatus 1.

The sensing node level control unit 10 operates in response to the control signal CTR in the write operation, is fed back with the voltage of the sensing node SN, and outputs the enable signal EN which can operate the write current driving unit 20. If the voltage level of the sensing node SN is lower than the voltage level of the reference voltage VREF, the enable signal EN is activated, and if the voltage level of the sensing node SN is higher than the voltage level of the reference voltage VREF, the enable signal EN is deactivated.

The NMOS transistor N of the write current driving unit 20 receives a first driving voltage VPP through a drain terminal D, and supplies write current I_WRITE through a source terminal S which is connected with a bit line BL, in response to the activated enable signal EN which is applied to a gate terminal G.

The memory cell 50 changes the resistance value of the phase change device R_GST when the write current I_WRITE is supplied in the direction of the ground voltage VSS.

Conversely, in the read operation of the nonvolatile memory apparatus 1, the sensing current driving unit 30 outputs sensing current I_SENSE to the memory cell 50 in response to the control signal CTR by using a second driving voltage VDD. The sense amplifier 40 senses the sensing current I_SENSE which varies according to the resistance value of the phase change substance R_GST and outputs data DQ. The sense amplifier 40 also receives a second reference voltage VREF2 through its positive terminal.

In general, the voltage level of the first driving voltage VPP supplied in the write operation of the nonvolatile memory apparatus 1 is higher than the voltage level of the second driving voltage VDD supplied in the read operation of the nonvolatile memory apparatus 1. This is to cause a phase change by inducing Joule heating in the phase change device R_GST in the write operation.

In this regard, even in the case where the enable signal EN is deactivated not to operate the NMOS transistor N of the write current driving unit 20, leakage current may be caused in the NMOS transistor N in the direction of the bit line BL by the first driving voltage VPP as a high voltage, due to gate-induced drain leakage (GIDL).

As a consequence, a problem may be encountered in that such leakage current influences the sensing current I_SENSE in the read operation and thus the data DQ stored in the memory cell 50 is likely to be erroneously read and outputted.

SUMMARY

In an embodiment of the present invention, a nonvolatile memory apparatus includes: a memory cell configured to receive first current and second current through a bit line which is connected to a sensing node; a sensing node level control unit configured to be driven in response to a control signal, compare a reference voltage and a voltage of the sensing node, and output a driving signal to a driving node; a first current driving unit configured to output the first current to the driving node by using a first driving voltage in response to the driving signal; and a current control unit configured to perform a discharge operation of the bit line or electrically connect the driving node and the sensing node, in response to the control signal.

In an embodiment of the present invention, a nonvolatile memory apparatus includes: a memory cell configured to receive first current and second current through a bit line which is connected to a sensing node; a first current supply block configured to compare a first reference voltage and a voltage of a sensing node and output the first current to a first driving node by using a first driving voltage, according to a control signal; a first current control unit configured to perform a discharge operation of the bit line or electrically connect the first driving node and the sensing node, in response to the control signal; a second current supply block configured to compare a second reference voltage and a voltage of the sensing node and output the second current to a second driving node by using a second driving voltage, according to the control signal; and a second current control unit configured to perform a discharge operation of the bit line or electrically connect the second driving node and the sensing node, in response to the control signal.

In an embodiment of the present invention, a nonvolatile memory apparatus includes: a memory cell configured to receive a current through a bit line which is connected to a sensing node; a sensing node level control unit coupled between a driving node and the sensing node, and configured to receive a control signal and a reference voltage and output a driving signal; a first current driving unit configured to output the current to the driving node; and a current control unit coupled between the driving node and the sensing node.

In an embodiment of the present invention, a nonvolatile memory apparatus includes: a memory cell configured to receive first current and second current through a bit line which is connected to a sensing node; a first sensing node level control unit coupled between a first driving node and the sensing node, and configured to receive a control signal and a first reference voltage and output a first driving signal; a first current driving unit configured to output the first current to the driving node; a first current control unit coupled between the driving node and the sensing node; a second sensing node level control unit coupled between a second driving node and the sensing node, and configured to receive a control signal and a second reference voltage and output a second driving signal; a second current driving unit configured to output the second current to the second driving node; and a second current control unit coupled between the second driving node and the sensing node.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus according to the present invention will be described below with reference to the accompanying drawings through various embodiments.

Figure 2:
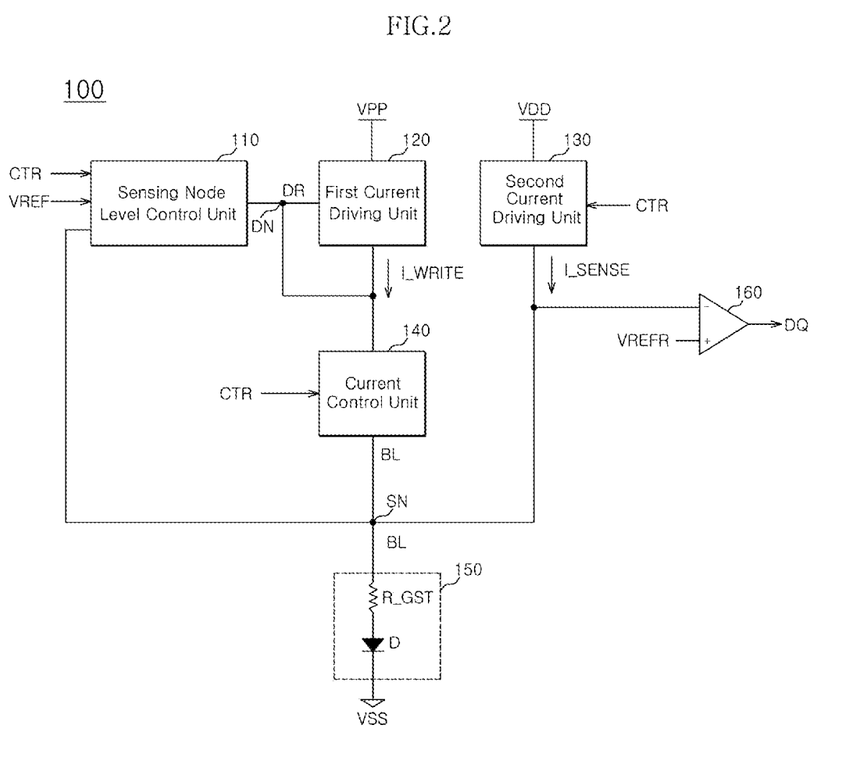
FIG. 2 is a block diagram of a nonvolatile memory apparatus in accordance with an embodiment of the present invention.

FIG. 2 is a block diagram of a nonvolatile memory apparatus 100 in accordance with an embodiment of the present invention.

The nonvolatile memory apparatus 100 may include a sensing node level control unit 110, a first current driving unit 120, a second current driving unit 130, a current control unit 140, a memory cell 150, and a sense amplifier 160. The memory cell 150 may include a phase change device R_GST which is constituted by a phase change substance, and a cell diode D.

The sensing node level control unit 110 may be configured to be driven in response to a control signal CTR, and output a driving signal DR to a driving node DN in response to the voltage levels of a reference voltage VREF and the voltage of a sensing node SN.

The control signal CTR is a signal which controls a read operation and a write operation of the nonvolatile memory apparatus 100. When the control signal CTR is enabled, the read operation is activated, and the write operation is deactivated. Conversely, when the control signal CTR is disabled, the write operation is activated, and the read operation is deactivated.

The sensing node level control unit 110 is driven when the disabled control signal CTR is inputted. At this time, if the voltage level of the sensing node SN is lower than the voltage level of the reference voltage VREF, the sensing node level control unit 110 enables and outputs the driving signal DR, and, if the voltage level of the sensing node SN is higher than the voltage level of the reference voltage VREF, the sensing node level control unit 110 disables and outputs the driving signal DR.

The first current driving unit 120 may be configured to receive a first driving voltage VPP and output first current I_WRITE in response to the driving signal DR.

The first current driving unit 120 operates when the driving signal DR is enabled, and outputs the first current I_WRITE using the first driving voltage VPP.

The current control unit 140 is connected between the driving node DN and the sensing node SN, and may be configured to determine whether to output the first current I_WRITE to the sensing node SN and whether to discharge a bit line BL, in response to the control signal CTR.

The current control unit 140 outputs the first current I_WRITE to the sensing node SN when the disabled control signal CTR is inputted, and intercepts the first current I_WRITE, flows the first current I_WRITE in a direction toward a ground voltage VSS and discharges the bit line BL when the enabled control signal CTR is inputted.

The memory cell 150 changes the resistance value of the phase change device R_GST in response to the first current I_WRITE which is transferred through the bit line BL.

The second current driving unit 130 may be configured to receive a second driving voltage VDD and output second current I_SENSE in response to the control signal CTR.

The second current driving unit 130 operates when the control signal CTR is enabled, and outputs the second current I_SENSE using the second driving voltage VDD.

The first current driving unit 120 is driven in the write operation of the nonvolatile memory apparatus 100, and changes the resistance value of the phase change device R_GST using the first current I_WRITE. Also, the second current driving unit 130 is driven in the read operation of the nonvolatile memory apparatus 100, and reads out the resistance value of the phase change device R_GST using the second current I_SENSE. Accordingly, since the first current I_WRITE is used to change the resistance value by applying Joule heating to the phase change device R_GST, the voltage level of the first driving voltage VPP used in generating the first current I_WRITE is higher than the voltage level of the second driving voltage VDD supplied to the second current driving unit 130.

The sense amplifier 160 may be configured to be driven in the read operation of the nonvolatile memory apparatus 100, compare the voltage of the sensing node SN and a read reference voltage VREFR, and outputs data DQ. That is to say, the sense amplifier 160 senses the current of the second current I_SENSE in the read operation, and reads the data DQ stored in the memory cell 150.

Figure 3:
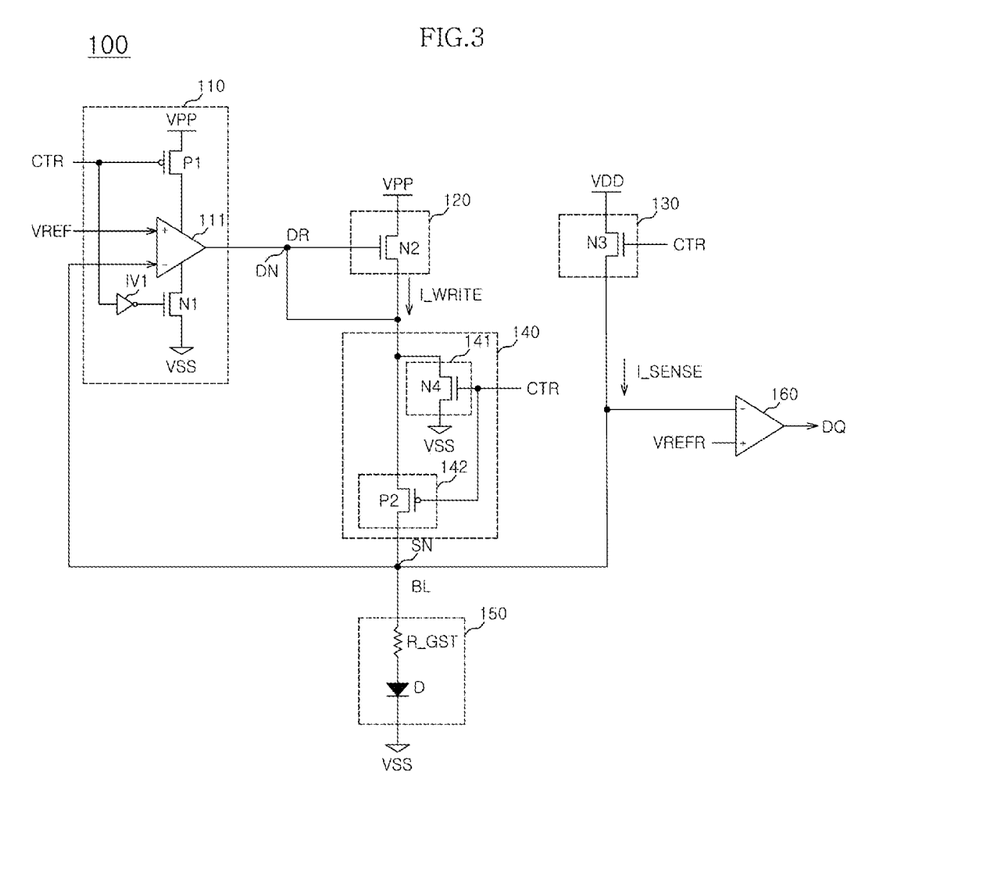
FIG. 3 is a detailed circuit diagram of the nonvolatile memory apparatus in accordance with the embodiments of the present invention.

FIG. 3 is a detailed circuit diagram of the nonvolatile memory apparatus 100 in accordance with the embodiments of the present invention.

The nonvolatile memory apparatus 100 may include a sensing node level control unit 110, a first current driving unit 120, a second current driving unit 130, a current control unit 140, a memory cell 150, and a sense amplifier 160. The current control unit 140 may include a discharge section 141 and a switch section 142. The memory cell 150 may include a phase change device R_GST which is constituted by a phase change substance, and a cell diode D.

The sensing node level control unit 110 may include a first PMOS transistor P1 which is connected between a first driving voltage VPP and a comparing section 111 and supplies the first driving voltage VPP to the comparing section 111 in response to a control signal CTR, a first inverter IV1 which inverts the control signal CTR, a first NMOS transistor N1 which is connected between a ground voltage VSS and the comparing section 111 and controls the operation of the comparing section 111 in response to the output signal of the first inverter IV1, and the comparing section 111 which compares the voltage levels of a reference voltage VREF and the voltage of a sensing node SN and outputs a driving signal DR to a driving node DN.

The sensing node level control unit 110 operates the comparing section 111 by turning on the first PMOS transistor P1 and the first NMOS transistor N1 in response to the disabled control signal CTR. If the first PMOS transistor P1 and the first NMOS transistor N1 are turned on, the comparing section 111 outputs the driving signal DR with a voltage level between the voltage levels of the first driving voltage VPP and the ground voltage VSS, to the driving node DN.

The control signal CTR is a signal which controls a read operation and a write operation of the nonvolatile memory apparatus 100. When the control signal CTR is enabled, the read operation is activated, and the write operation is deactivated. Conversely, when the control signal CTR is disabled, the write operation is activated, and the read operation is deactivated.

If the voltage level of the sensing node SN is lower than the voltage level of the reference voltage VREF, the sensing node level control unit 110 enables and outputs the driving signal DR, and, if the voltage level of the sensing node SN is higher than the voltage level of the reference voltage VREF, the sensing node level control unit 110 disables and outputs the driving signal DR.

Conversely, the sensing node level control unit 110 turns off and interrupts operations of the first PMOS transistor P1 and the first NMOS transistor N1 in response to the enabled control signal CTR.

If the operations of the first PMOS transistor P1 and the first NMOS transistor N1 are interrupted, the comparing section 111 does not output the driving signal DR to the driving node DN. However, since the comparing section 111 is fed back with the voltage of the sensing node SN, leakage current is likely to occur in the driving node DN due to the characteristic of feedback that a feedback input and an output show a tendency to be the same with each other.

The first current driving unit 120 may include a second NMOS transistor N2 which is connected between the first driving voltage VPP and the driving node DN and outputs first current I_WRITE in response to the driving signal DR.

The first current driving unit 120 is turned on when the enabled driving signal DR is inputted, and outputs the first current I_WRITE using the first driving voltage VPP. Conversely, the first current driving unit 120 is turned off and does not operate when the disabled driving signal DR is inputted.

Nevertheless, as described above, even when the nonvolatile memory apparatus 100 is in a read operation mode and thus the comparing section 111 does not output the enabled or disabled driving signal DR, leakage current is likely to occur from the comparing section 111 to the gate of the second NMOS transistor N2. Also, the first driving voltage VPP is supplied to the drain of the second NMOS transistor N2. Due to this fact, during the read operation of the nonvolatile memory apparatus 100, leakage current is likely to occur from the first current driving unit 120 toward a bit line BL by gate-induced drain leakage (GIDL).

The second current driving unit 130 may include a third NMOS transistor N3 which is connected between a second driving voltage VDD and the sensing node SN and outputs a second current I_SENSE in response to the control signal CTR.

The third NMOS transistor N3 is turned on when the enabled control signal CTR is inputted and outputs the second current I_SENSE using the second driving voltage VDD. Conversely, the third NMOS transistor N3 is turned off and does not operate when the disabled control signal CTR is inputted.

The current control unit 140 may include the discharge section 141 and the switch section 142. The discharge section 141 may include a fourth NMOS transistor N4 which is connected between the driving node DN and the ground voltage VSS and discharges the bit line BL in response to the control signal CTR. The switch section 142 may include a second PMOS transistor P2 which is connected between the driving node DN and the sensing node SN and determines whether to output the first current I_WRITE, in response to the control signal CTR.

When the nonvolatile memory apparatus 100 is in the write operation, the current control unit 140 turns off the fourth NMOS transistor N4 in response to the disabled control signal CTR and interrupts a discharge operation. Also, the current control unit 140 turns on the second PMOS transistor P2 in response to the disabled control signal CTR, electrically connects the sensing node SN and the driving node DN, and supplies the first current I_WRITE outputted from the first current driving unit 120, to the sensing node SN.

When the nonvolatile memory apparatus 100 is in the read operation, the current control unit 140 turns on the fourth NMOS transistor N4 in response to the enabled control signal CTR, flows the leakage current outputted from the comparing section 111 through the first current driving unit 120, toward the ground voltage VSS, and discharges the bit line BL. Also, the current control unit 140 turns off the second PMOS transistor P2 in response to the enabled control signal CTR, and disconnects the sensing node SN and the driving node DN from each other.

The memory cell 150 is supplied with the first current I_WRITE and the second current I_SENSE, and changes the resistance value of the phase change device R_GST using the first current I_WRITE.

The sense amplifier 160 is driven in the read operation of the nonvolatile memory apparatus 100, compares the voltage of the sensing node SN and a read reference voltage VREFR, and outputs data DQ. That is to say, the sense amplifier 160 senses the current of the second current I_SENSE in the read operation, and reads the data DQ stored in the memory cell 150.

Figure 4:
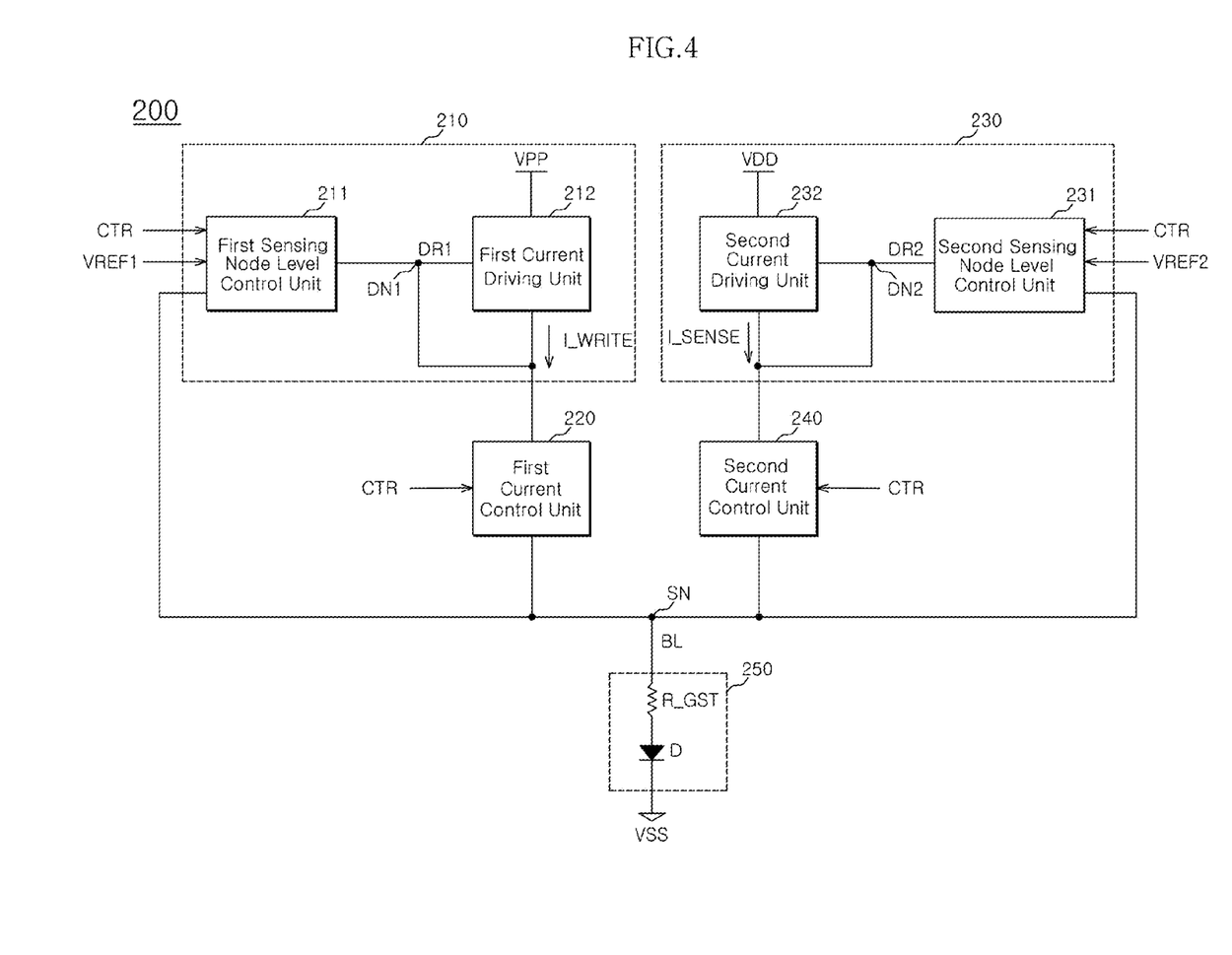
FIG. 4 is a block diagram of a nonvolatile memory apparatus in accordance with other embodiments of the present invention.

FIG. 4 is a block diagram of a nonvolatile memory apparatus 200 in accordance with other embodiments of the present invention.

The nonvolatile memory apparatus 200 may include a first current supply block 210, a first current control unit 220, a second current supply block 230, a second current control unit 240, and a memory cell 250.

The first current supply block 210 may include a first sensing node level control unit 211, and a first current driving unit 212. The second current supply block 230 may include a second sensing node level control unit 231, and a second current driving unit 232. The memory cell 250 may include a phase change device R_GST which is constituted by a phase change substance, and a cell diode D.

The first current supply block 210 may be configured to compare a first reference voltage VREF1 and the voltage of a sensing node SN in response to a control signal CTR, and output a first current I_WRITE using a first driving voltage VPP.

Additionally, the first sensing node level control unit 211 may be configured to be driven in response to the control signal CTR, and output a first driving signal DR1 to a first driving node DN1 in response to the voltage levels of the first reference voltage VREF1 and the voltage of the sensing node SN.

The control signal CTR is a signal which controls a read operation and a write operation of the nonvolatile memory apparatus 200. When the control signal CTR is enabled, the read operation is activated, and the write operation is deactivated. Conversely, when the control signal CTR is disabled, the write operation is activated, and the read operation is deactivated.

The first sensing node level control unit 211 is driven when the disabled control signal CTR is inputted. At this time, if the voltage level of the sensing node SN is lower than the voltage level of the first reference voltage VREF1, the first sensing node level control unit 211 enables and outputs the first driving signal DR1, and, if the voltage level of the sensing node SN is higher than the voltage level of the first reference voltage VREF1, the first sensing node level control unit 211 disables and outputs the first driving signal DR1.

The first current driving unit 212 may be configured to receive the first driving voltage VPP and output the first current I_WRITE in response to the first driving signal DR1.

The first current driving unit 212 operates when the first driving signal DR1 is enabled, and outputs the first current I_WRITE using the first driving voltage VPP.

The first current control unit 220 is connected between the first driving node DN1 and the sensing node SN, and may be configured to determine whether to output the first current I_WRITE to the sensing node SN and whether to discharge a bit line BL, in response to the control signal CTR.

The first current control unit 220 outputs the first current I_WRITE to the sensing node SN when the disabled control signal CTR is inputted, and when the enabled control signal CTR is inputted, the first current control unit 220 intercepts the first current I_WRITE, allowing the first current I_WRITE to flow in a direction toward a ground voltage VSS.

The memory cell 250 changes the resistance value of the phase change device R_GST in response to the first current I_WRITE which is transferred through the bit line BL.

The second current supply block 230 may be configured to compare a second reference voltage VREF2 and the voltage of the sensing node SN in response to the control signal CTR, and output a second current I_SENSE using a second driving voltage VDD.

Additionally, the second sensing node level control unit 231 may be configured to be driven in response to the control signal CTR, and output a second driving signal DR2 to a second driving node DN2 in response to the voltage levels of the second reference voltage VREF2 and the voltage of the sensing node SN.

The second sensing node level control unit 231 is driven when the enabled control signal CTR is inputted. At this time, if the voltage level of the sensing node SN is lower than the voltage level of the second reference voltage VREF2, the second sensing node level control unit 231 enables and outputs the second driving signal DR2, and, if the voltage level of the sensing node SN is higher than the voltage level of the second reference voltage VREF2, the second sensing node level control unit 231 disables and outputs the second driving signal DR2.

The second current driving unit 232 may be configured to receive the second driving voltage VDD and output the second current I_SENSE in response to the second driving signal DR2.

The second current driving unit 232 operates when the second driving signal DR2 is enabled, and outputs the second current I_SENSE using the second driving voltage VDD.

The second current control unit 240 is connected between the second driving node DN2 and the sensing node SN, and may be configured to determine whether to output the second current I_SENSE to the sensing node SN and whether to discharge the bit line BL, in response to the control signal CTR.

The second current control unit 240 outputs the second current I_SENSE to the sensing node SN when the enabled control signal CTR is inputted, and when the disabled control signal CTR is inputted, the second current control unit intercepts the second current I_SENSE, allowing the second current I_SENSE to flow in a direction toward the ground voltage VSS.

The first current supply block 210 is driven in the write operation of the nonvolatile memory apparatus 200, and changes the resistance value of the phase change device R_GST by outputting the first current I_WRITE. Also, the second current supply block 230 is driven in the read operation of the nonvolatile memory apparatus 200, and allows the resistance value of the phase change device R_GST to be read, by outputting the second current I_SENSE. Accordingly, since the first current I_WRITE is used to change the resistance value by applying Joule heating to the phase change device R_GST, the voltage level of the first driving voltage VPP used in generating the first current I_WRITE is higher than the voltage level of the second driving voltage VDD supplied to the second current supply block 230.

Figure 5:
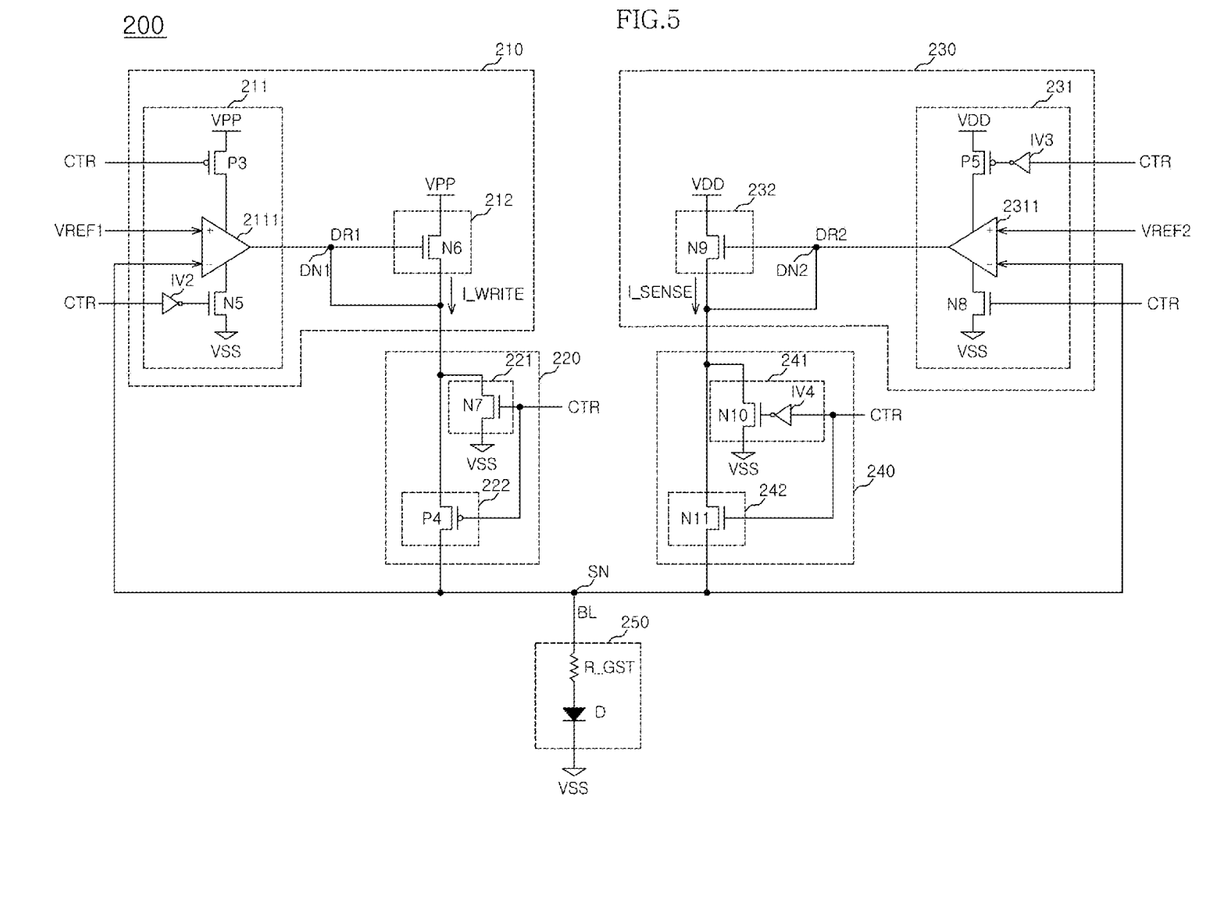
FIG. 5 is a detailed circuit diagram of the nonvolatile memory apparatus in accordance with the other embodiments of the present invention.

FIG. 5 is a detailed circuit diagram of the nonvolatile memory apparatus 200 in accordance with the other embodiments of the present invention.

The nonvolatile memory apparatus 200 may include a first current supply block 210, a first current control unit 220, a second current supply block 230, a second current control unit 240, and a memory cell 250.

The first current supply block 210 may include a first sensing node level control unit 211, and a first current driving unit 212. The second current supply block 230 may include a second sensing node level control unit 231, and a second current driving unit 232. The memory cell 250 may include a phase change device R_GST which is constituted by a phase change substance, and a cell diode D.

The first current supply block 210 may be configured to compare a first reference voltage VREF1 and the voltage of a sensing node SN in response to a control signal CTR, and output first current I_WRITE using a first driving voltage VPP.

Additionally, the first sensing node level control unit 211 may include a third PMOS transistor P3 which is connected between the first driving voltage VPP and a first comparing section 2111 and supplies the first driving voltage VPP to the first comparing section 2111 in response to the control signal CTR, a second inverter IV2 which inverts the control signal CTR, a fifth NMOS transistor N5 which is connected between a ground voltage VSS and the first comparing section 2111 and controls the operation of the first comparing section 2111 in response to the output signal of the second inverter IV2, and the first comparing section 2111 which compares the voltage levels of the first reference voltage VREF1 and the voltage of the sensing node SN and outputs a first driving signal DR1 to a first driving node DN1.

The first sensing node level control unit 211 operates the first comparing section 2111 by turning on the third PMOS transistor P3 and the fifth NMOS transistor N5 in response to the disabled control signal CTR. If the third PMOS transistor P3 and the fifth NMOS transistor N5 are turned on, the first comparing section 2111 outputs the first driving signal DR1 with a voltage level between the voltage levels of the first driving voltage VPP and the ground voltage VSS, to the first driving node DN1.

If the voltage level of the sensing node SN is lower than the voltage level of the first reference voltage VREF1, the first sensing node level control unit 211 enables and outputs the first driving signal DR1, and, if the voltage level of the sensing node SN is higher than the voltage level of the first reference voltage VREF1, the first sensing node level control unit 211 disables and outputs the first driving signal DR1.

The first sensing node level control unit 211 turns off and interrupts operations of the third PMOS transistor P3 and the fifth NMOS transistor N5 in response to the enabled control signal CTR.

If the operations of the third PMOS transistor P3 and the fifth NMOS transistor N5 are interrupted, the first comparing section 2111 does not output the first driving signal DR1 to the first driving node DN1. However, since the first comparing section 2111 is fed back with the voltage of the sensing node SN, leakage current is likely to occur in the first driving node DN1 due to the characteristic of feedback that a feedback input and an output show a tendency to be the same with each other.

The first current driving unit 212 may include a sixth NMOS transistor N6 which is connected between the first driving voltage VPP and the first driving node DN1 and outputs the first current I_WRITE in response to the first driving signal DR1.

The first current driving unit 212 is turned on when the enabled first driving signal DR1 is inputted, and outputs the first current I_WRITE using the first driving voltage VPP. Conversely, the first current driving unit 212 is turned off and does not operate when the disabled first driving signal DR1 is inputted.

Nevertheless, as described above, even when the nonvolatile memory apparatus 200 is in a read operation mode and thus the first comparing section 2111 does not output the enabled or disabled first driving signal DR1, leakage current is likely to occur from the first comparing section 2111 to the gate of the sixth NMOS transistor N6. Also, the first driving voltage VPP is supplied to the drain of the sixth NMOS transistor N6. Due to this fact, during the read operation of the nonvolatile memory apparatus 200, leakage current is likely to occur from the first current driving unit 212 toward a bit line BL by gate-induced drain leakage (GIDL).

The first current control unit 220 may include a first discharge section 221 and a first switch section 222. The first discharge section 221 may include a seventh NMOS transistor N7 which is connected between the first driving node DN1 and the ground voltage VSS and discharges the bit line BL in response to the control signal CTR. The first switch section 222 may include a fourth PMOS transistor P4 which is connected between the first driving node DN1 and the sensing node SN and determines whether to output the first current I_WRITE, in response to the control signal CTR.

When the nonvolatile memory apparatus 200 is in the write operation, the first current control unit 220 turns off the seventh NMOS transistor N7 in response to the disabled control signal CTR and interrupts a discharge operation. Also, the first current control unit 220 turns on the fourth PMOS transistor P4 in response to the disabled control signal CTR, electrically connects the sensing node SN and the first driving node DN1, and supplies the first current I_WRITE outputted from the first current supply block 210, to the sensing node SN.

When the nonvolatile memory apparatus 200 is in the read operation, the first current control unit 220 turns on the seventh NMOS transistor N7 in response to the enabled control signal CTR, flows the leakage current outputted from the first comparing section 2111 through the first current driving unit 212, toward the ground voltage VSS, and discharges the bit line BL. Also, the first current control unit 220 turns off the fourth PMOS transistor P4 in response to the enabled control signal CTR, and disconnects the sensing node SN and the first driving node DN1 from each other.

Next, the second current supply block 230 may be configured to compare a second reference voltage VREF2 and the voltage of the sensing node SN in response to the control signal CTR, and output a second current I_SENSE using a second driving voltage VDD.

Additionally, the second sensing node level control unit 231 may include a third inverter IV3 which is connected between the second driving voltage VDD and a second comparing section 2311 and inverts the control signal CTR, a fifth PMOS transistor P5 which supplies the second driving voltage VDD to the second comparing section 2311 in response to the output signal of the third inverter IV3, an eighth NMOS transistor N8 which is connected between the ground voltage VSS and the second comparing section 2311 and controls the operation of the second comparing section 2311 in response to the control signal CTR, and the second comparing section 2311 which compares the voltage levels of the second reference voltage VREF2 and the voltage of the sensing node SN and outputs a second driving signal DR2 to a second driving node DN2.

The second sensing node level control unit 231 operates the second comparing section 2311 by turning on the fifth PMOS transistor P5 and the eighth NMOS transistor N8 in response to the enabled control signal CTR. If the fifth PMOS transistor P5 and the eighth NMOS transistor N8 are turned on, the second comparing section 2311 outputs the second driving signal DR2 with a voltage level between the voltage levels of the second driving voltage VDD and the ground voltage VSS, to the second driving node DN2.

If the voltage level of the sensing node SN is lower than the voltage level of the second reference voltage VREF2, the second sensing node level control unit 231 enables and outputs the second driving signal DR2, and, if the voltage level of the sensing node SN is higher than the voltage level of the second reference voltage VREF2, the second sensing node level control unit 231 disables and outputs the second driving signal DR2.

The second sensing node level control unit 231 turns off and interrupts operations of the fifth PMOS transistor P5 and the eighth NMOS transistor N8 in response to the disabled control signal CTR.

If the operations of the fifth PMOS transistor P5 and the eighth NMOS transistor N8 are interrupted, the second comparing section 2311 does not output the second driving signal DR2 to the second driving node DN2. However, since the second comparing section 2311 is fed back with the voltage of the sensing node SN, leakage current is likely to occur in the second driving node DN2 due to the characteristic of feedback that a feedback input and an output show a tendency to be the same with each other.

The second current driving unit 232 may include a ninth NMOS transistor N9 which is connected between the second driving voltage VDD and the second driving node DN2 and outputs the second current I_SENSE in response to the second driving signal DR2.

The second current driving unit 232 is turned on when the enabled second driving signal DR2 is inputted, and outputs the second current I_SENSE using the second driving voltage VDD. Conversely, the second current driving unit 232 is turned off and does not operate when the disabled second driving signal DR2 is inputted.

Nevertheless, as described above, even when the nonvolatile memory apparatus 200 is in a write operation mode and thus the second comparing section 2311 does not output the enabled or disabled second driving signal DR2, leakage current is likely to occur from the second comparing section 2311 to the gate of the ninth NMOS transistor N9. Also, the second driving voltage VDD is supplied to the drain of the ninth NMOS transistor N9. Due to this fact, during the write operation of the nonvolatile memory apparatus 200, leakage current is likely to occur from the second current driving unit 232 toward the bit line BL by gate-induced drain leakage (GIDL).

The second current control unit 240 may include a second discharge section 241 and a second switch section 242. The second discharge section 241 may include a fourth inverter IV4 which inverts the control signal CTR, and a tenth NMOS transistor N10 which is connected between the second driving node DN2 and the ground voltage VSS and discharges the bit line BL in response to the output signal of the fourth inverter IV4.

The second switch section 242 may include an eleventh NMOS transistor N11 which is connected between the second driving node DN2 and the sensing node SN and determines whether to output the second current I_SENSE, in response to the control signal CTR.

When the nonvolatile memory apparatus 200 is in the read operation, the second current control unit 240 turns off the tenth NMOS transistor N10 in response to the enabled control signal CTR and interrupts a discharge operation. Also, the second current control unit 240 turns on the eleventh NMOS transistor N11 in response to the enabled control signal CTR, electrically connects the sensing node SN and the second driving node DN2, and supplies the second current I_SENSE outputted from the second current supply block 230, to the sensing node SN.

When the nonvolatile memory apparatus 200 is in the write operation, the second current control unit 240 turns on the tenth NMOS transistor N10 in response to the disabled control signal CTR, flows the leakage current outputted from the second comparing section 2311 through the second current driving unit 232, toward the ground voltage VSS, and discharges the bit line BL. Also, the second current control unit 240 turns off the eleventh NMOS transistor N11 in response to the disabled control signal CTR, and disconnects the sensing node SN and the second driving node DN2 from each other.

The memory cell 250 is supplied with the first current I_WRITE and the second current I_SENSE, and changes the resistance value of the phase change device R_GST by the first current I_WRITE. Further, the resistance value of the phase change device R_GST is read by the second current I_SENSE.

While various embodiments have been described above, it will be understood to those skilled in the art that the embodiments described are by way of example only. Accordingly, the nonvolatile memory apparatus described herein should not be limited based on the described embodiments. Rather, the nonvolatile memory apparatus described herein should only be limited in light of the claims that follow when taken in conjunction with the above description and accompanying drawings.

What is claimed is:

1. A nonvolatile memory apparatus comprising:
a memory cell configured to receive a first current and a second current through a bit line which is connected to a sensing node;
a sensing node level control unit configured to be driven in response to a control signal, compare a reference voltage and a voltage of the sensing node, and output a driving signal to a driving node;
a first current driving unit configured to output the first current to the driving node by using a first driving voltage in response to the driving signal; and
a current control unit configured to perform a discharge operation of the bit line or electrically connect the driving node and the sensing node, in response to the control signal.

2. The nonvolatile memory apparatus according to claim 1, wherein the current control unit comprises:
a discharge section configured to discharge the bit line in response to the control signal; and
a switch section configured to determine whether to connect the driving node and the sensing node with each other, in response to the control signal.

3. The nonvolatile memory apparatus according to claim 2, further comprising:
a second current driving unit configured to output the second current to the sensing node by using a second driving voltage in response to the control signal.

4. The nonvolatile memory apparatus according to claim 3, wherein a write operation is performed for the memory cell according to the first current, and a read operation for reading information stored in the memory cell is performed by the second current.

5. The nonvolatile memory apparatus according to claim 3, wherein the control signal is enabled in the read operation and is disabled in the write operation.

6. The nonvolatile memory apparatus according to claim 5, wherein the discharge section connects the driving node with a ground voltage in response to the enabled control signal and discharges the bit line.

7. The nonvolatile memory apparatus according to claim 5, wherein the switch section connects the driving node and the sensing node with each other in response to the disabled control signal.

8. The nonvolatile memory apparatus according to claim 5, wherein the sensing node level control unit is driven in response to the disabled control signal, enables the driving signal when a voltage level of the sensing node is lower than a voltage level of the reference voltage, and disables the driving signal when a voltage level of the sensing node is higher than the voltage level of the reference voltage.

9. The nonvolatile memory apparatus according to claim 8, wherein the first current driving unit outputs the first current using the first driving voltage in response to the enabled control signal.

10. The nonvolatile memory apparatus according to claim 8, wherein the second current driving unit outputs the second current using the second driving voltage in response to the enabled control signal.

11. A nonvolatile memory apparatus comprising:
a memory cell configured to receive first current and second current through a bit line which is connected to a sensing node;
a first current supply block configured to compare a first reference voltage and a voltage of a sensing node and output the first current to a first driving node by using a first driving voltage, according to a control signal;
a first current control unit configured to perform a discharge operation of the bit line or electrically connect the first driving node and the sensing node, in response to the control signal;
a second current supply block configured to compare a second reference voltage and a voltage of the sensing node and output the second current to a second driving node by using a second driving voltage, according to the control signal; and
a second current control unit configured to perform a discharge operation of the bit line or electrically connect the second driving node and the sensing node, in response to the control signal.

12. The nonvolatile memory apparatus according to claim 11, wherein the first current supply block comprises:
a first sensing node level control unit configured to be driven in response to the control signal, compare the first reference voltage and the voltage of the sensing node, and output a first driving signal to the first driving node; and
a first current driving unit configured to output the first current to the first driving node by using the first driving voltage in response to the first driving signal.

13. The nonvolatile memory apparatus according to claim 12, wherein the first current control unit comprises:
a first discharge section configured to discharge the bit line in response to the control signal; and
a first switch section configured to determine whether to connect the first driving node and the sensing node with each other, in response to the control signal.

14. The nonvolatile memory apparatus according to claim 13, wherein the second current control unit comprises:
a second discharge section configured to discharge the bit line in response to the control signal; and
a second switch section configured to determine whether to connect the second driving node and the sensing node with each other, in response to the control signal.

15. The nonvolatile memory apparatus according to claim 14, wherein the control signal is enabled in the read operation and is disabled in the write operation.

16. The nonvolatile memory apparatus according to claim 15, wherein the first discharge section connects the first driving node with a ground voltage in response to the enabled control signal and discharges the bit line.

17. The nonvolatile memory apparatus according to claim 15, wherein the first switch section connects the first driving node and the sensing node with each other in response to the disabled control signal.

18. The nonvolatile memory apparatus according to claim 15, wherein the second discharge section connects the second driving node with the ground voltage in response to the disabled control signal and discharges the bit line.

19. The nonvolatile memory apparatus according to claim 15, wherein the second switch section connects the second driving node and the sensing node with each other in response to the enabled control signal.

20. The nonvolatile memory apparatus according to claim 11, wherein the second current supply block comprises:
a second sensing node level control unit configured to be driven in response to the control signal, compare the second reference voltage and the voltage of the sensing node, and output a second driving signal to the second driving node; and
a second current driving unit configured to output the second current to the second driving node by using the second driving voltage in response to the second driving signal.

21. A nonvolatile memory apparatus comprising:
a memory cell configured to receive first current and second current through a bit line which is connected to a sensing node;
a first sensing node level control unit coupled between a first driving node and the sensing node, and configured to receive a control signal and a first reference voltage and output a first driving signal;
a first current driving unit configured to output the first current to the driving node;
a first current control unit coupled between the driving node and the sensing node;
a second sensing node level control unit coupled between a second driving node and the sensing node, and configured to receive a control signal and a second reference voltage and output a second driving signal;
a second current driving unit configured to output the second current to the second driving node; and
a second current control unit coupled between the second driving node and the sensing node.

22. The nonvolatile memory apparatus according to claim 21, wherein:
the first current driving unit outputs the first current to the first driving node by using a first driving voltage in response to the first driving signal; and
the second current driving unit outputs the second current to the second driving node by using a second driving voltage in response to the second driving signal.

23. The nonvolatile memory apparatus according to claim 22, wherein the first driving voltage is greater than the second driving voltage.

* * * * *